US008220969B2

(12) United States Patent
Bornhorst

(10) Patent No.: US 8,220,969 B2
(45) Date of Patent: Jul. 17, 2012

(54) LIGHT COLORING SYSTEM

(75) Inventor: James Bornhorst, De Soto, TX (US)

(73) Assignee: Production Resource Group, LLC, New Windsor, NY (US)

(*) Notice: Subject to any disclaimer, the term of this patent is extended or adjusted under 35 U.S.C. 154(b) by 0 days.

(21) Appl. No.: 13/302,338

(22) Filed: Nov. 22, 2011

(65) Prior Publication Data

US 2012/0063144 A1 Mar. 15, 2012

Related U.S. Application Data

(63) Continuation of application No. 12/123,679, filed on May 20, 2008, now Pat. No. 8,061,874.

(60) Provisional application No. 60/931,308, filed on May 21, 2007.

(51) Int. Cl.
*F21V 9/00* (2006.01)
*F21V 8/00* (2006.01)
*G03B 21/14* (2006.01)
*G02B 5/22* (2006.01)

(52) U.S. Cl. .......... 362/293; 362/268; 353/84; 359/890; 359/891

(58) Field of Classification Search .................. 362/293, 362/311.03, 583; 353/84; 359/890, 891, 359/892, 502; 352/42; 348/743, 744; 40/433
See application file for complete search history.

(56) References Cited

U.S. PATENT DOCUMENTS

| | | |
|---|---|---|
| 5,758,955 A | 6/1998 | Belliveau |
| 5,969,868 A | 10/1999 | Bornhorst et al. |
| 7,283,181 B2 | 10/2007 | Allen et al. |
| 7,311,404 B2 | 12/2007 | Hori |
| 7,586,703 B2 | 9/2009 | Thollot et al. |
| 2005/0211298 A1 | 9/2005 | Frohwein |
| 2006/0132722 A1 | 6/2006 | Colpaert |
| 2006/0215128 A1 | 9/2006 | Iwanaga |
| 2007/0058088 A1 | 3/2007 | Schubert et al. |
| 2007/0195207 A1 | 8/2007 | Wang |
| 2009/0200967 A1 | 8/2009 | Bergman et al. |

OTHER PUBLICATIONS

Hatt, J., "The Colorist," 1908, D. Van Nostrand Company, Nomenclature Chart No. 2.

*Primary Examiner* — David Crowe
(74) *Attorney, Agent, or Firm* — Law Office of Scott C. Harris, Inc.

(57) ABSTRACT

A rainbow wheel that colors light that is passed therethrough. The wheel can be formed using a photolithographic process. Another supermagenta wheel can be used to increase the number of colors that can be obtained.

17 Claims, 8 Drawing Sheets

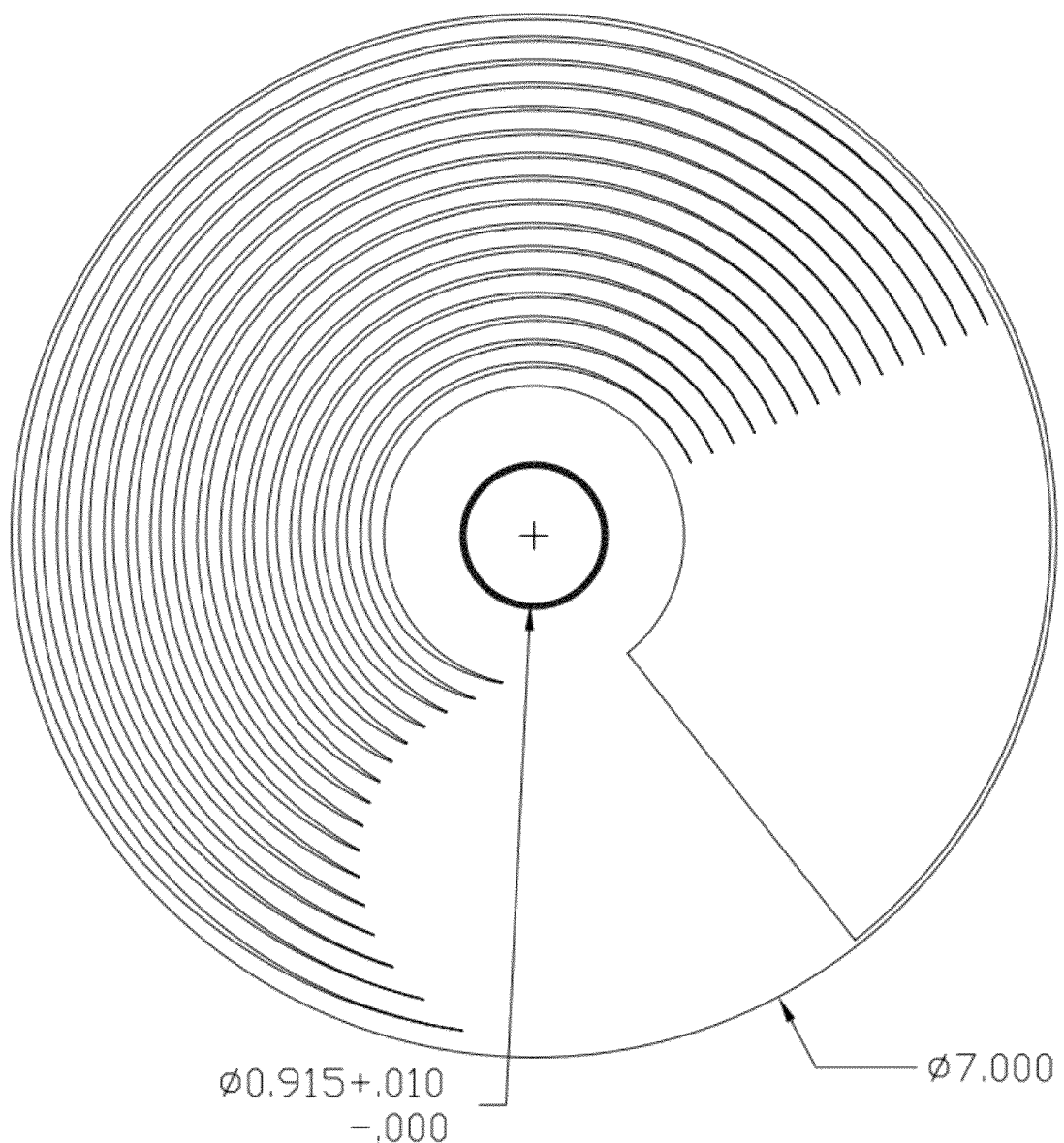

LIGHT COLORING SYSTEM

CROSS-REFERENCE

This application is a continuation application of U.S. Ser. No. 12/123,679 filed May 20, 2008, now U.S. Pat. No. 8,061,874 issued Nov. 22, 2011, which claims priority to provisional application Ser. No. 60/931,308 filed May 21, 2007, the disclosure of which is herewith incorporated by reference.

BACKGROUND

U.S. Pat. No. 4,392,187 (hereinafter '187), having a common inventor to the present application, describes a stage lighting system that is used to project a high intensity beam of light having certain variable characteristics such as shape, color and position. In '187, a high intensity discharge lamp provides a compact source of white light. The white light is colored by a dichroic color changing system that allows producing a large range of different colors. The colors, as well as other properties of the light, can be controlled using a digital control architecture. The digital control architecture allows transmitting commands from a central control console to the light.

Different kinds of light and colors of light can be produced by this kind of system.

SUMMARY

The present application describes a new and continuously variable color changing system that can be used to color light.

BRIEF DESCRIPTION OF THE DRAWINGS

FIG. 8 illustrates a circumferential saturation gradient used for the photolithographic etch process;

DETAILED DESCRIPTION

Figure 1:
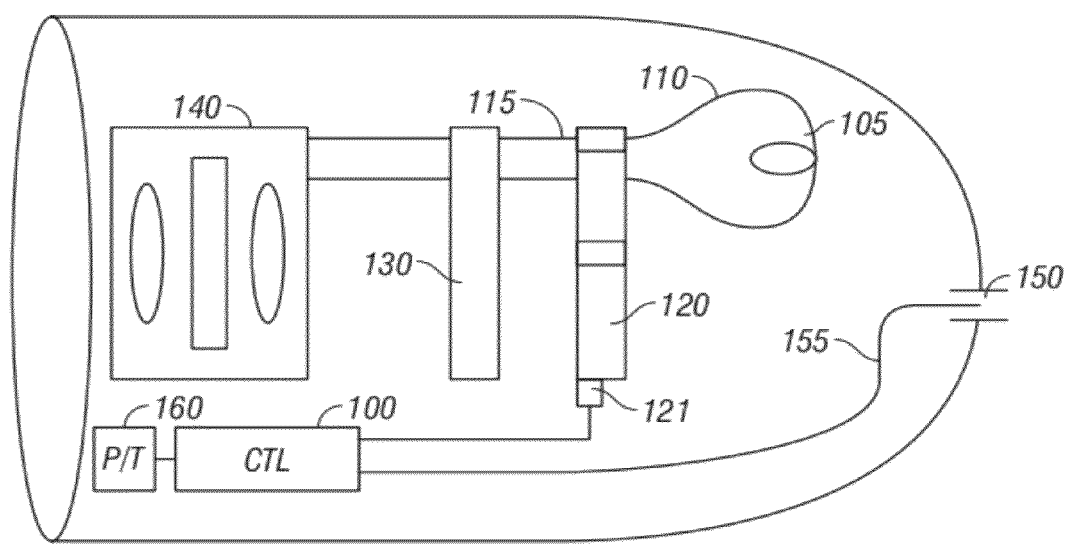
FIG. 1 shows an embodiment including how the color wheels of the embodiments are used.

The general structure and techniques, and more specific embodiments which can be used to effect different ways of carrying out the more general goals, are described herein.

Different kinds of coloring systems may be used to color light in a controllable high intensity lighting system, such as a stage lighting system. The term 'stage lighting system' is used to describe these lights, but it should be understood that these can be used in other venues, such as stores, and architectural lighting. The lights are preferably lights with high intensity bulbs, e.g., greater than 200 watts, 500 watts or 700 watts.

It is possible to use a system of multiple different color wheels, such as three color wheels, all arranged in series within the light beam. Such a system might use multiple openings near the periphery of each wheel, for example each wheel having eight openings through which light can be passed. Seven of those eight openings may be fitted with a multilayered dielectric interference filter that provides color to the beam. The last hole is open so that white light can be passed through that wheel, thereby enabling more variety in the final colored light.

The filters may be arranged in families on each wheel to interact with each other to create a large variety of colors. If three wheels are fitted with 21 discrete filters, over 60 unique colors can be generated.

Another color system may take advantage of the unusual and generally disadvantageous property of dichroics, that a filter characteristic may change based on the angle of incidence of the light on the filter. A continuously variable color changing system may be created based on this effect. Such a filter may use a multilayer interference filter that builds a continuously variable color changing system, allowing colors to be gradually faded from one color to the next color. This fading eliminates the drastic changing color that might occur with the multiple analog color wheels. However, if a CYM color filter is used, it may not be continuously variable throughout its entire range. Rather, such a filter often has a piecewise continuously variable color. A system similar to this was used in the Vari-Lite VL3 luminaire.

Another color system may use an optical coating technology to deposit a variable thickness coating stack. These variable thickness or wedged coatings may change the optical properties across the coated substrate to create a continuum of color. The Vari-Lite VL7 luminaire used two of these color plates. The first plate used two linearly variable bandpass coatings which were capable of producing all of the colors in the rainbow on the single plate.

The inventor notes, however, that human color perception includes not only the colors of the rainbow, but also the ability to detect a range of complex colors such as magentas, lavenders and purples that are a mix of various percentages of red and blue wavelengths. The VL7, for example, used a variable notch filter in order to create and expand the range of continuous color.

These color systems may be expensive, and also may create a complex optical system to homogenize the projected color. Such a system was also arranged along the long axis of a rectangular plate. Changing from one end of the color system to the other (usually red to blue) required that the colors passed through interim colors (green) during the movement. Many observers find this interim color to be undesirable.

A CYM mixing system can be formed using three patterned color wheels that subtractively create color in a way that is similar to that used by the print industry. Three cylindrical circular glass wheels are each coated, respectively, with cyan, magenta, and yellow, e.g. using a dichroic filter stack. The wheels are patterned using photolithographic and chemical etch techniques to remove parts of the filter coating and selected areas. The completed wheel has a completely uncoated area that allows white light to pass. At the opposite extreme, the wheel has a completely coated area that fully saturates the color of the beam. A density patterned area is in between the two, which has a variable saturation gradient.

The wheels may be used in pairs or in triples to create partial color limited continual color range. For example, the magenta wheel may be used in combination with the yellow wheel, to generate the entire range of yellow to orange to red to magenta colors.

While this system produces good color, the inventor has recognized that this system is inherently limited in the color space it can produce. A color space is defined by the cyan, yellow and magenta filters. The color space can be modified by selecting different color points for the filters, but the space remains limited.

The inventor recognized that this is particularly weak in producing saturated colors.

The inventor recognized another disadvantage of this system: that it is sometimes difficult to fade between two different colors, especially when three wheels are involved in creating the color. Getting from red to green requires that the magenta wheel be moved to the white area, while the cyan wheel moves to full saturation and the yellow wheel stays fixed. The transitioning can create unwanted interim colors.

An embodiment disclosed herein may use a dichroic coated color altering device that can individually produce all the colors of a CYM system. A second color altering device is used in conjunction with the rainbow wheel to increase the saturation capability of the color combination.

An embodiment is shown in FIG. 1. A luminaire 100 has a housing as shown, and a high intensity lamp 105 that shines a light beam 110 along an optical path shown generally as 115. One or both of a first color wheel 120 and second color wheel 130 are arranged in series in the path of the optical beam 115. Additional optics 140 may further be used to homogenize and/or shape the beam. A wire connection 150 may provide power for the light, and may also provide a control signal 155 that is received by a controller, that controls different functions of the light including positions of the color wheels 120 and 130. 2-dimensional pan and tilt motor(s) 160 may also control the position of the light.

In the embodiment, the wheel 120 is a rainbow wheel, and the wheel 130 is a special saturation-inducing wheel.

Figure 2:
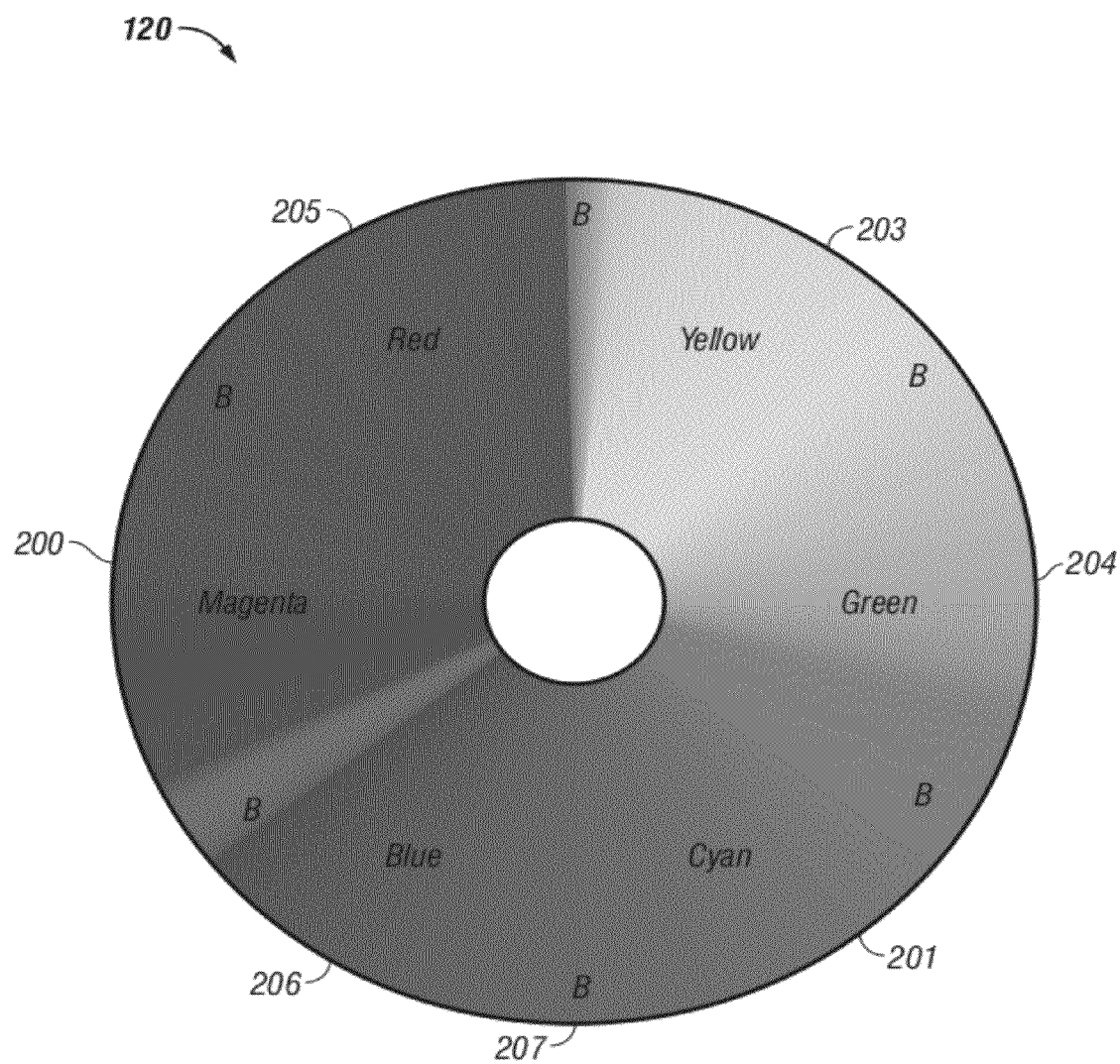
FIG. 2 illustrates a color wheel showing the effect of the combination of the three patterned films.

The wheel 120 is illustrated in FIG. 2. The wheel has sections of pure saturated colors as well as sections of subtractive secondary colors. For example, approximately 30.degree. of the wheel is developed for each of the pure subtractive primary colors: the cyan section 201, the magenta section 202, and the yellow section 203. The primary colors overlap to create regions of subtractive secondaries, with a green section 204, a red section 205, and a blue section 206. These subtractive secondaries may also be sectors of approximately 30.degree.

The six 30.degree. sectors account for approximately half the wheel. The remaining half of the wheel is taken up by six interleaved 30.degree. regions, where the primaries and secondaries blend together. For example, section 207 is a blend from the cyan portion 201 to the blue portion 206. These blended regions allow a smooth transition when crossfading between different wheel parts.

The fabrication of the wheel 120 may use a round glass disk with a clear central portion 210. First, the disk is coated with a magenta dichroic layer. This coating is selectively patterned using the density mask of FIG. 3 to remove portions in a way that creates a circumferential saturation gradient.

After the patterning, a second coating process is used to overlay a yellow dichroic film. That yellow film is again patterned and removed. The resulting overlaying patterned film creates a circumstantial color continuum ranging from yellow to orange to red to magenta.

This process is repeated for a third time using a cyan patterned coating. This eventually produces a wheel that has all saturated colors that are defined by the color points of the three cyan, yellow and magenta primary filters.

Figure 3:
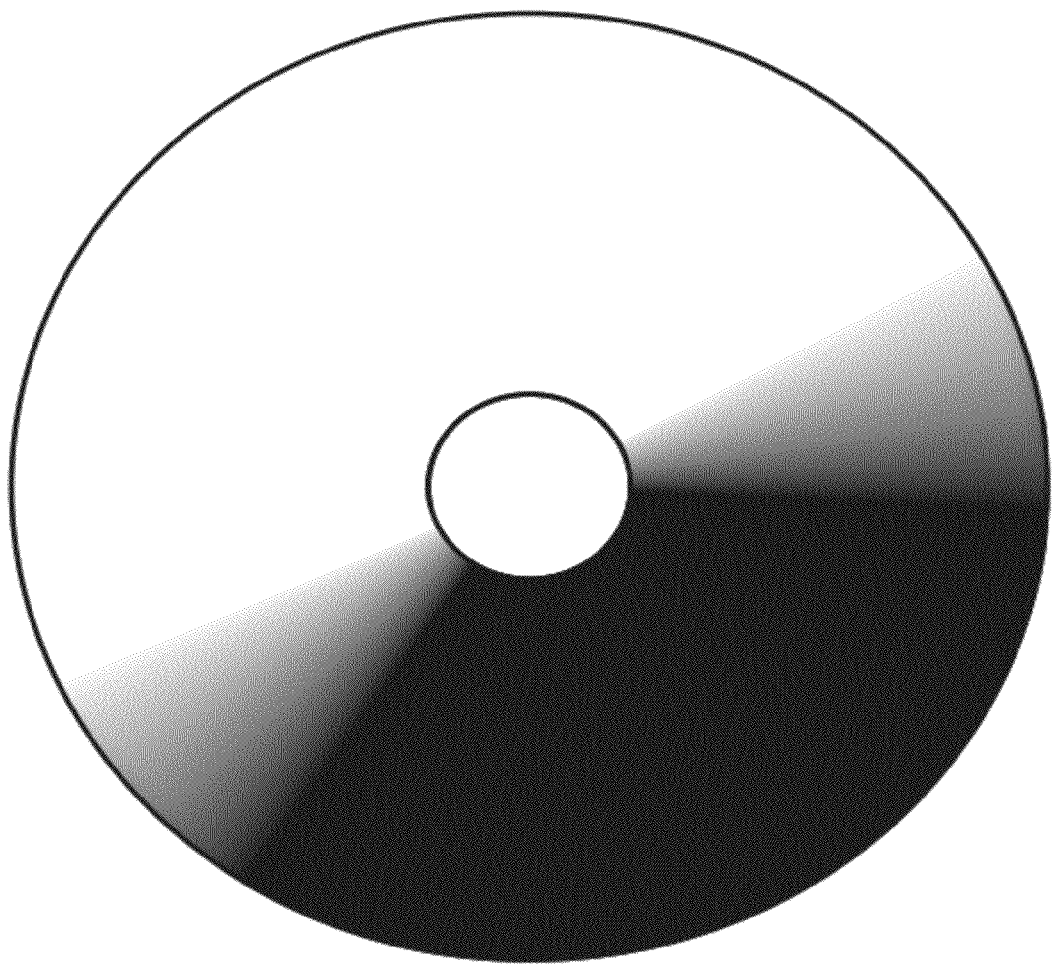
FIG. 3 illustrates a typical pattern used for the photolithographic etch process.

FIG. 3 illustrates a typical pattern that may be used for the photolithographic etch process. This pattern may be repeated every 120.degree. to form the 30.degree. sequence of colors going around the wheel. A half tone or stochastic or any other pattern blend may therefore be formed in 120.degree. increments.

The above embodiment describes the colors being arranged symmetrically around the wheel. However, according to another embodiment, the colors may be laid out on the wheel using any color distribution scheme. For example, other colors may be added to the system, and different links can be applied for the transitions, more transitions can be provided, and other arrangements can be used. In addition, other embodiments may eliminate some of the colors, and may expand the areas of other one of the colors. The designer may want, for example, a wheel where red is right next to green. The color arrangement may be developed on any computer using graphics software. Satisfactorily arranged colors can be converted into a set of CYM separations using standard print media software. These separations may then be formed into film negatives that are used to expose a photoresist that controls the overall etching process.

The embodiment described above shows a rainbow color wheel that has all possible CYM colors at full saturation. Another embodiment may include areas of softer colors or less saturated colors as part of the wheel. These unsaturated colors may be used to enhance the color of an object, such as a costume or scenery.

Figure 4:
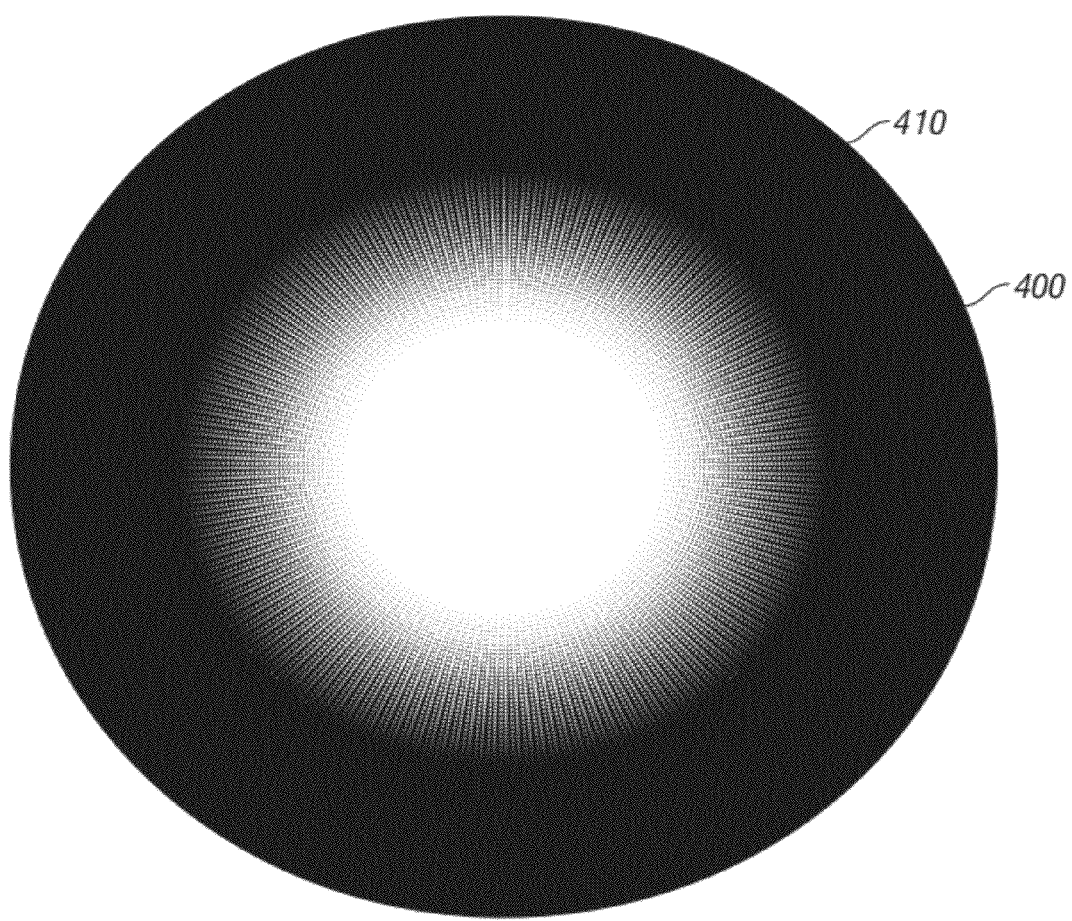
FIG. 4 illustrates a typical radial saturation gradient with white at the center.

In an extended embodiment, a second radial pattern may be overlaid on the first circumferential pattern during the wheel fabrication. The radial gradient shown in FIG. 4 may be used as a pattern for the overlay. This pattern creates a saturation gradient, where there is less saturation towards the center in the area 410 than there is at the outer portion area 400. This saturation gradient in FIG. 4 may be combined with the color gradients of FIG. 3, and incorporated into a single pattern for each of the three photolithographic etch process.

In an enhanced embodiment, the most saturated colors may reside at the outer periphery of the wheel. The wheel may have its parts positioned so that the color gradient across the light beam area may be minimal. For example, the saturated portion, shown as the black outer portion 400 in FIG. 4, may be at least as wide as a light beam.

Less saturated colors are provided towards the clear center 420 of the beam. This may be an area where the coating is applied, for example, in a speckled patter as shown. The center portion may be clear white, to thereby allow pure white light to be projected.

Figure 5:
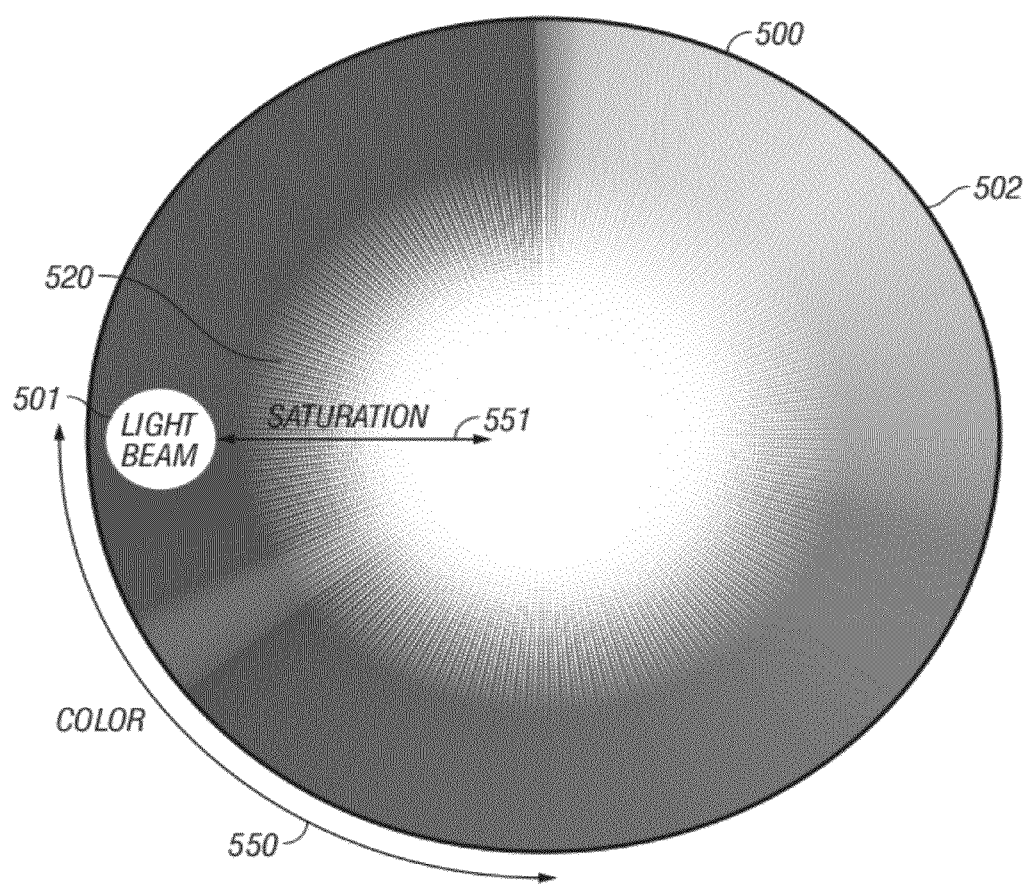
FIG. 5 shows how the finished rainbow wheel may look.

An example of the finished rainbow wheel which uses the saturation gradient may be as shown in FIG. 5. The light beam 501 is shown in the area of full saturation, with the saturation gradient area 520 illustrated as an inner portion.

In order to use a system of this type with a clear center portion, the color wheel 500 may be mounted in a carrier that supports the outer edges 502 of the color wheel only. The carrier allows the color wheel to rotate within the light beam to select the color by moving in the direction of the arrow 550. The carrier also allows the color wheel to move in the direction of the arrow 551, to adjust the saturation of the rainbow wheel. Hence, this arrangement allows for movement in two different dimensions, where linear movement (e.g. left to right) adjusts saturation; rotational movement adjusts color. This may facilitate the control implementation. In an embodiment two different control knobs may remotely adjust color and saturation independently on the single wheel. In the FIG. 1 embodiment, the remote line 155 may contain control information from a remote console, which is passed to the control part 121 that controls the movement of the color changer. In this embodiment, all of that movement to the entire available color scheme, can be controlled with only two controls, e.g., two knobs. This compares with the control that would be necessary for a CYM system, in which three knobs, one for each of the cyan wheel, the yellow wheel and the magenta wheel, would be necessary.

Another embodiment may use a second color wheel to expand the range of the domain of colors available from the CYM color wheel. A second color wheel 130 is shown in FIG. 1. This second color wheel is coated with a super-magenta saturated color. The super-magenta coating has a wider rejection band than the magenta layer that is formed on the rainbow wheel, and hence is a more saturated magenta than the magenta on the rainbow wheel.

The super-magenta color wheel is patterned using a similar circumferential saturation gradient shown in FIG. 8. As in FIG. 4, the super-magenta wheel includes a region of full saturation where none of the coating is removed. The super-magenta wheel also has a graded saturation area, and a clear area which allows light to pass unfiltered.

FIG. 1 illustrates how the super-magenta wheel 130 can be used in an embodiment. The super-magenta wheel is placed optically in series with the rainbow wheel within the light beam. Because the super magenta color is composed of a deeper blue and a deeper red color concentration than the corresponding magenta in the rainbow wheel, these deeper colors may be gradually used to modify the rainbow wheel colors. The effect is that the blue color range generated by the rainbow wheel can be expanded to include the very deep blues when the super magenta wheel is used in conjunction with the rainbow wheel.

The same effect is true for the reds. The red that is generated by the rainbow wheel alone, like many CYM reds, is slightly on the orangey side. When the rainbow wheel red is altered by the super magenta wheel, the resulting light is adjusted to a very deep and saturated red.

The rainbow magenta is naturally a pinkish magenta since this hue provides the most variety of colors when used in combination with the cyan and yellow filters. However, the super magenta wheel adjusts the rainbow magenta to a more purplish hue, allowing a more dramatic color shift.

Figure 6:
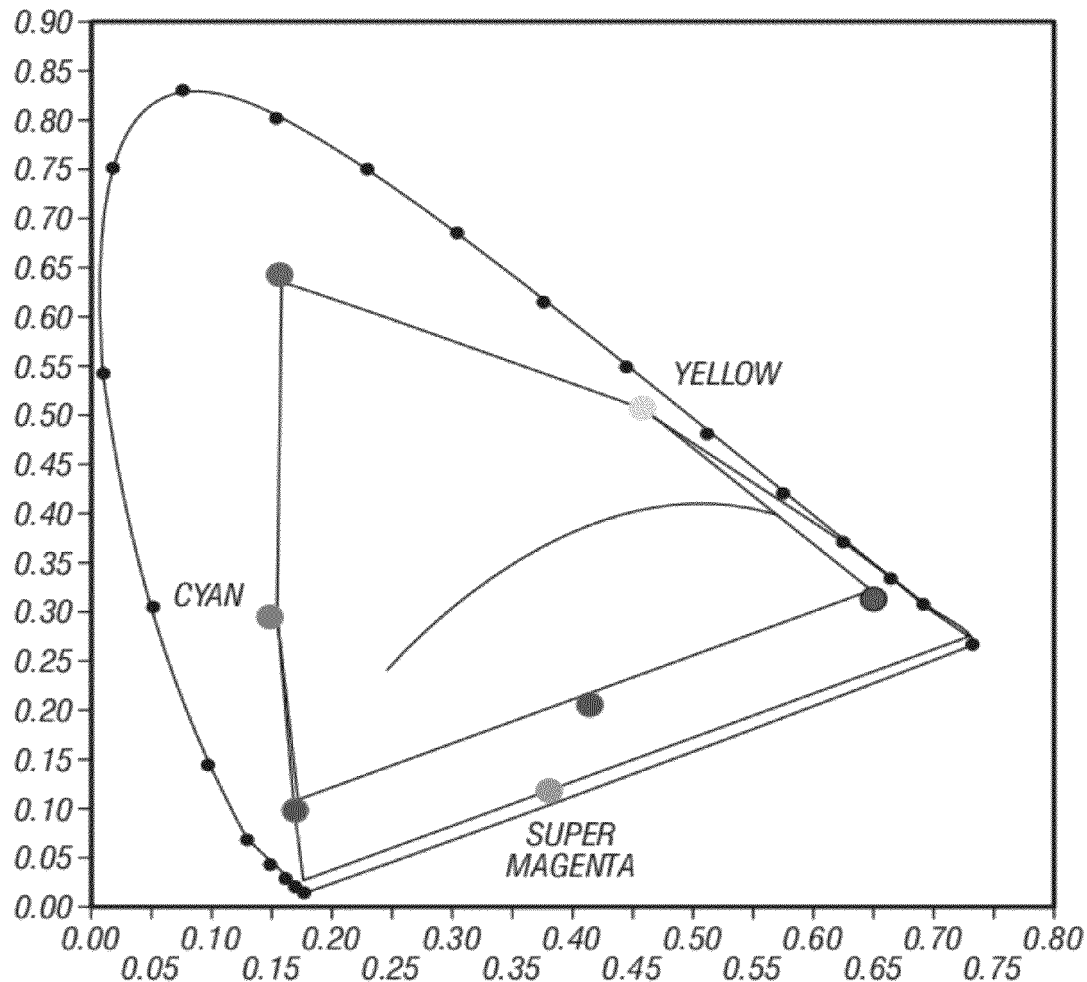
FIG. 6 illustrates the CIE color domain for two different color wheels disclosed as embodiments.

FIG. 6 illustrates the CIE color domain for the two different wheels. The color points for the CYM filter are shown as the inner domain, illustrated as a five-sided polygon that is bounded by the different colors in the wheel. The super-magenta color wheel allows expanding this region considerably, to the outer expansion portion shown. The red outline shows the more saturated region of the color domain that is achievable with the combination of the two wheels. This can also be controlled in a similar way to that discussed above with respect to the rainbow wheel. While the rainbow wheel can be controlled with two different knobs, the combination of the rainbow wheel with the super-magenta color wheel can expand the realm of hue and saturation, e.g. using an additional two knobs.

Figure 7:
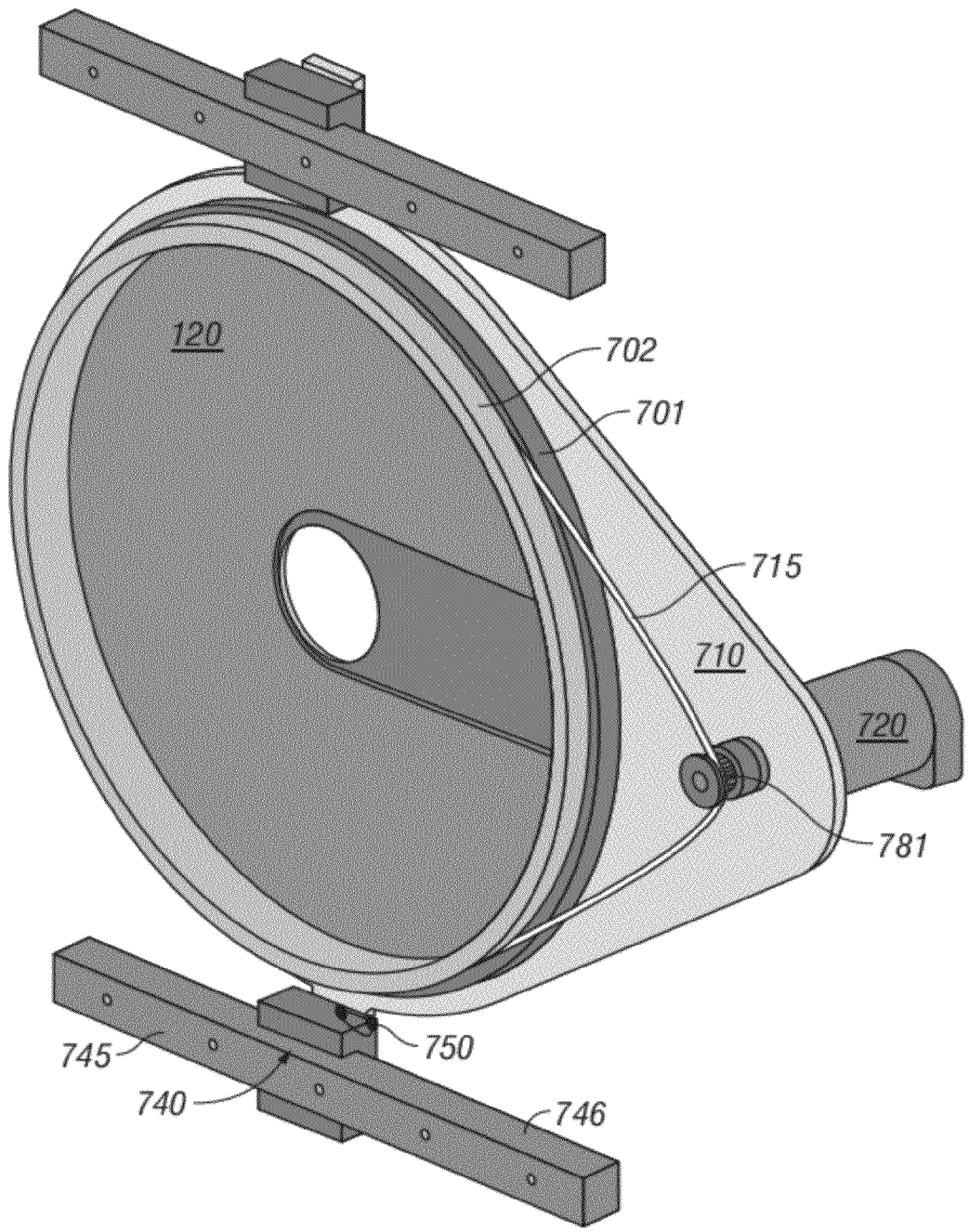
FIG. 7 illustrates an exemplary holder for the wheels.

FIG. 7 illustrates an exemplary holder for the rainbow wheel. The wheel 120 is supported in a ball bearing carrier 701 that itself is supported on a mounting plate 710. A second supporting ring 702 may be used for rotating the wheel. For example, 702 may have timing teeth on its outer diameter, and may interface with a drive belt shown as 715. The drive belt itself may be driven by a drive motor 720 that transmits its rotational force to a driving pulley 721. The pulley 721 may be transmitted via the belt to the pulley 702. Alternatively, the driving mayor may not connect directly to the pulley 702.

The mounting plate itself 710 may translate left to right on linear bearings shown as 740 that themselves translate on a mounting rails 745. The plate 710 can move left to right via motion between bearing 740 in the rail 745. The rail may have a slot shown as 746 which accommodates the translation across the beam.

A lead screw nut 750 may control the movement of the device 745. The lead screw nut 750 may include a motor that moves the mounting plate 710 in the left and right direction.

Although only a few embodiments have been disclosed in detail above, other embodiments are possible and the inventors intends these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, while the above has described the form of those systems being a wheel, it should be understood that other forms for the coloration can be used. For example, the outer shape of the device can be rectangular instead of round.

Also, the inventor intends that only those claims which use the words "means for" are intended to be interpreted under 35 USC 112, sixth paragraph. Moreover, no limitations from the specification are intended to be read into any claims, unless those limitations are expressly included in the claims.

This system can be used in the light of the type shown in FIG. 1 which can be controlled by a remote console, that communicates with the light over wired or wireless protocols such as DMX 512. Both the console and the light can include computers therein. The computers described herein may be any kind of computer, either general purpose, or some specific purpose computer such as a workstation. The computer may be an Intel (e.g., Pentium Core 2 duo) or AMD based computer, running Windows XP or Linux, or may be a Macintosh computer. The computer may also be a handheld computer, such as a PDA, cellphone, or laptop.

The programs may be written in C or python, or Java, Brew or any other programming language. The programs may be resident on a storage medium, e.g., magnetic or optical, e.g. the computer hard drive, a removable disk or media such as a memory stick or SD media, wired or wireless network based or Bluetooth based Network attached Storage (NAS), or other removable medium.

The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

What is claimed is:

1. A coloring device for an optical system, comprising: a first coloring device, having a coloring surface, divided into a plurality of primary sections, and a plurality of mixing sections, each defining a specified area of said coloring surface, the coloring surface comprising: a first primary section formed with a first subtractive primary color section covering a first area and having a constant color over said first subtractive primary color section, and a first additive primary color section covering a second area of said first primary section, and a mixing section covering a third area of said first primary section between said first subtractive primary color and said first additive primary color section, where said mixing section has a varying color across said third area between said first subtractive primary color section and said first additive primary color section;

a second primary section formed with a second subtractive primary color section covering a first area of said second primary section and having a constant color over said second subtractive primary color section, and a second additive primary color section covering a second area of said second primary section, and a mixing section covering a third area of said second primary section between said second subtractive primary color and said second additive primary color section, where said mixing section of said second primary section has a varying color across said third area between said second subtractive primary color section and said second additive primary color section;

a third primary section formed with a third subtractive primary color section covering a first area of said third primary section and having a constant color over said third subtractive primary color section, and a third additive primary color section covering a second area of said third primary section, and a mixing section covering a third area of said third primary section between said third subtractive primary color and said third additive primary color section, where said mixing section has a varying color across said third area between said third subtractive primary color section and said third additive primary color section;

a first mixing section covering a first mixing area in between said first subtractive primary color section of said first primary section and said second primary additive color section of said second primary section, where said first mixing section has a varying color over said first mixing area, and forms varying amounts of blend between said first subtractive primary color section and said second primary additive color sections, and allows a smooth transition when fading between said first subtractive primary color section and said second primary additive color section;

a second mixing section covering a second mixing area in between said second subtractive primary color section of said second primary section and said third primary additive color section of said third primary section, where said second mixing section has a varying color over said second mixing area, and forms varying amounts of blend between said second subtractive primary color section and said third primary additive color sections, and allows a smooth transition when fading between said second subtractive primary color section and said third primary additive color section;

a third mixing section covering a third mixing area in between said third subtractive primary color section of said third primary area and said first primary additive color section of said first primary area, where said third mixing section has a varying color over said third mixing area, and forms varying amounts of blend between said third subtractive primary color section and said first primary additive color sections, and allows a smooth transition when fading between said third subtractive primary color section and said first primary additive color section, wherein each area of each primary section and each mixing area are approximately equal in size.

2. The coloring device as in claim 1, wherein said first primary section includes red and magenta.

3. The device as in claim 2, further comprising a second coloring device, separate from said first coloring device, said second coloring device having a magenta color, that is more deeply magenta saturated than any magenta color on said first subtractive primary color section of said first coloring device.

4. The coloring device as in claim 1, wherein said second primary section includes blue and cyan.

5. The coloring device as in claim 1, wherein said coloring surface is formed of first, second and third patterned dichroic films.

6. A device as in claim 1, wherein said coloring surface has a substantially round outer periphery defining a wheel.

7. The device as in claim 6, wherein said wheel has a varying saturation from its outside towards its inside.

8. The device as in claim 7, wherein there is a fully saturated section forming an outermost circumferential portion of the coloring surface.

9. A lighting device, comprising:

a light source;

a first color changing structure, located to change a light created by said light source, said first color changing structure comprising:

a first section formed with a first subtractive primary color section covering a first area of said first section and having a constant color over said first subtractive primary color section, and a first additive primary color section covering a second area of said first section, and a mixing section covering a third area of said first section between said first subtractive primary color and said first additive primary color section, where said mixing section has a varying color across said third area between said first subtractive primary color section and said first additive primary color section;

a second section formed with a second subtractive primary color section covering a first area of said second section and having a constant color over said second subtractive primary color section, and a second additive primary color section covering a second area of said second section, and a mixing section covering a third area of said second section between said second subtractive primary color and said second additive primary color section, where said mixing section has a varying color across said third area between said second subtractive primary color section and said second additive primary color section;

a third section formed with a third subtractive primary color section covering a first area of said third section and having a constant color over said third subtractive primary color section, and a third additive primary color section covering a second area of said third section, and a mixing section covering a third area of said third section between said third subtractive primary color and said third additive primary color section, where said mixing section has a varying color across said third area between said third subtractive primary color section and said third additive primary color section; said color changing structure further comprising:

a first mixing section covering a first mixing area in between said first subtractive primary color section and said second primary additive color section, where said first mixing section has a varying color over said first mixing area, and forms varying amounts of blend between said first subtractive primary color section and said second primary additive color sections, and allows a smooth transition when fading between said first subtractive primary color section and said second primary additive color section;

a second mixing section covering a second mixing area in between said second subtractive primary color section and said third primary additive color section, where said second mixing section has a varying color over said second mixing area, and forms varying amounts of blend between said second subtractive primary color section and said third primary additive color sections, and allows a smooth transition when fading between said second subtractive primary color section and said third primary additive color section;
a third mixing section covering a third mixing area in between said third subtractive primary color section and said first primary additive color section, where said third mixing section has a varying color over said third mixing area, and forms varying amounts of blend between said third subtractive primary color section and said first primary additive color sections, and allows a smooth transition when fading between said third subtractive primary color section and said first primary additive color section; and
a motor, connected to move said first color changing structure; and
a controller, controlling said motor to move said color changing structure between desired colors, wherein each area of each section and each mixing area are approximately equal in size.

10. The lighting device as in claim 9, wherein said first section includes red and magenta.

11. The lighting device as in claim 9, wherein said second section includes blue and cyan.

12. The lighting device as in claim 9, wherein said first color changing structure is formed of first, second and third patterned dichroic films.

13. The lighting device as in claim 9, wherein said first color changing structure has a substantially round outer periphery.

14. The lighting device as in claim 9, wherein said first color changing structure is a wheel which has a varying saturation from its outside towards its inside.

15. The lighting device as in claim 14 further comprising a clear inner portion of the wheel.

16. The lighting device as in claim 9, further comprising a second color changing structure, separate from said first color changing structure, said second color changing structure having a magenta color, that is more deeply magenta saturated than any magenta color on said first color changing structure.

17. The lighting device as in claim 9, wherein said first color changing structure is on a wheel, and, further comprising a carrier for said wheel, holding said wheel by an outer edge thereof, and allowing any portion of said wheel, including an inner portion thereof, to be directed into an area of a light beam, wherein said inner portion thereof is clear.

* * * * *